(12) United States Patent
Shi

(10) Patent No.: US 10,381,379 B2
(45) Date of Patent: Aug. 13, 2019

(54) ARRAY SUBSTRATE AND MANUFACTURING METHOD THEREOF, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Dawei Shi, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/135,934

(22) Filed: Apr. 22, 2016

(65) Prior Publication Data

US 2016/0365363 A1    Dec. 15, 2016

(30) Foreign Application Priority Data

Jun. 11, 2015   (CN) .......................... 2015 1 0320010

(51) Int. Cl.
*H01L 27/12*    (2006.01)
*G02F 1/1343*   (2006.01)
(Continued)

(52) U.S. Cl.
CPC ........ *H01L 27/1214* (2013.01); *G02F 1/1368* (2013.01); *G02F 1/13439* (2013.01);
(Continued)

(58) Field of Classification Search
CPC ................................................ H01L 27/1259
(Continued)

(56) References Cited

U.S. PATENT DOCUMENTS

2006/0092362 A1\* 5/2006 Lin .................. G02F 1/134363
349/141
2009/0295694 A1 12/2009 Chung et al.
(Continued)

FOREIGN PATENT DOCUMENTS

CN    103777418 A    5/2014
CN    104656325 A    5/2015

OTHER PUBLICATIONS

Office Action dated May 18, 2017 issued in corresponding Chinese Application No. 201510320010.8.

*Primary Examiner* — Moazzam Hossain
*Assistant Examiner* — Omar Mojaddedi
(74) *Attorney, Agent, or Firm* — Nath, Goldberg & Meyer; Joshua B. Goldberg; Scott H. Blackman

(57) ABSTRACT

The present invention discloses an array substrate and a manufacturing method thereof, and a display device, the array substrate includes a pixel electrode and a thin film transistor, the pixel electrode includes a first sub-electrode, a first connection part formed integrally with the first sub-electrode, a second sub-electrode, and a second connection part formed integrally with the second sub-electrode, the first sub-electrode and the second sub-electrode are insulated from each other and are disposed in different layers, and both the first connection part and the second connection part are connected to a drain of the thin film transistor. With the present invention, the pixel electrode of the discrete pattern structure can be manufactured to have a narrow gap smaller than the resolution of the exposure machine, to solve the problem that the single-layered pixel electrode of the discrete pattern structure cannot be resolved by the existing exposure machine.

10 Claims, 2 Drawing Sheets

(51) Int. Cl.
  *G02F 1/1368* (2006.01)
  *G02F 1/1362* (2006.01)
  *G02F 1/1333* (2006.01)
(52) U.S. Cl.
  CPC .. *G02F 1/134309* (2013.01); *G02F 1/134363* (2013.01); *H01L 27/1259* (2013.01); *G02F 1/136227* (2013.01); *G02F 2001/133357* (2013.01); *G02F 2001/134345* (2013.01)
(58) Field of Classification Search
  USPC .......................................................... 257/72
  See application file for complete search history.

(56) References Cited

U.S. PATENT DOCUMENTS

| | | | |
|---|---|---|---|
| 2010/0163862 A1* | 7/2010 | Yang | H01L 27/1214 257/43 |
| 2014/0197413 A1* | 7/2014 | Liu | H01L 27/124 257/59 |
| 2016/0011467 A1 | 1/2016 | Choi et al. | |
| 2016/0141426 A1* | 5/2016 | Chang | H01L 29/78696 257/43 |
| 2016/0195746 A1* | 7/2016 | Hong | G02F 1/1368 257/72 |
| 2016/0238912 A1* | 8/2016 | Yen | G02F 1/136227 |
| 2017/0045767 A1 | 2/2017 | Xu et al. | |

\* cited by examiner

ARRAY SUBSTRATE AND MANUFACTURING METHOD THEREOF, AND DISPLAY DEVICE

FIELD OF THE INVENTION

The present invention relates to the field of display technology, and in particular, relates to an array substrate and a manufacturing method thereof and a display device.

BACKGROUND OF THE INVENTION

As resolution of a display screen is higher and higher, size of a single pixel is decreased gradually, and a pitch between two adjacent pixels is also becoming smaller gradually. As for a product in which the top electrode functions as the pixel electrode, as shown in FIG. 1, since the electric field is the strongest at the edges of the pixel electrode 1, where the liquid crystal molecules rotate largest, and thus the transmission is improved, the pixel electrode 1 is generally designed to have a discrete pattern structure of two strips of sub-electrodes, as shown in FIG. 2.

Compared with the design scheme of a single strip of pixel electrode, the pixel electrode of the discrete pattern structure has significantly increased transmission. Moreover, in the pixel electrode of the discrete pattern structure, the smaller the gap between the two strips of sub-electrodes is, the higher the entire transmission of the product is.

However, the pixel electrode of the discrete pattern structure is different from the common electrode in design, and residue of the electrode material is not allowed to exist in the gap between the two sub-electrodes. Thus, when the resolution of the display screen is increased continuously, the pixel electrode of the discrete pattern structure is limited by the resolution of the exposure machine in the size design, and a too fine gap cannot be achieved, and in this case only the single strip of pixel electrode may be used, which will significantly decrease the transmission, and is not good for the improvement of the product performance.

SUMMARY OF THE INVENTION

The object of the present invention is to provide an array substrate and a manufacturing method thereof, and a display device, so as to solve the technical problem that the size design and the manufacturing procedure of the pixel electrode of the discrete pattern structure are limited by the resolution of the exposure machine.

In order to solve the above technical problem, as a first aspect of the present invention, an array substrate is provided to include a pixel electrode and a thin film transistor, wherein the pixel electrode includes a first sub-electrode, a first connection part formed integrally with the first sub-electrode, a second sub-electrode, and a second connection part formed integrally with the second sub-electrode; the first sub-electrode and the second sub-electrode are insulated from each other and are disposed in different layers; and both the first connection part and the second connection part are connected to a drain of the thin film transistor.

Preferably, a first passivation layer is disposed between the first sub-electrode and the second sub-electrode, and the first sub-electrode and the second sub-electrode are insulated from each other by the first passivation layer.

Preferably, the first passivation layer has a thickness in the range of 300 Å-500 Å.

Preferably, the first passivation layer is made of any one or more of silicon oxide and silicon nitride.

Preferably, the first sub-electrode includes a first strip-shaped part and a first bending part connected to the first strip-shaped part; the first bending part and the first connection part are located at two ends of the first strip-shaped part, respectively; the second sub-electrode includes a second strip-shaped part and a second bending part connected to the second strip-shaped part; the second bending part and the second connection part are located at two ends of the second strip-shaped part, respectively; and an orthogonal projection of the first bending part on the array substrate is at least partially overlapped with an orthogonal projection of the second bending part on the array substrate.

Preferably, one of the first sub-electrode and the second sub-electrode located in the lower layer has a width larger than or equal to that of the other one in the upper layer.

Preferably, the array substrate further includes a substrate, and a gate, a gate insulation layer, an active layer, a source and a drain, a planarization layer, a common electrode and a second passivation layer sequentially disposed on the substrate, wherein the pixel electrode is formed on the second passivation layer.

Preferably, the second passivation layer is provided with a second through hole therein; the first connection part is electrically connected to the drain by passing through the second through hole; a first passivation layer is disposed between the first sub-electrode and the second sub-electrode; the first passivation layer is provided with a first through hole therein; the second connection part is electrically connected to the drain by passing through the first through hole; and the first through hole and the second through hole are disposed coaxially.

As a second aspect of the present invention, a display device is provided to include the above array substrate provided by the invention.

As a third aspect of the present invention, a manufacturing method of an array substrate to include steps of forming a thin film transistor and forming a pixel electrode, wherein the step of forming a pixel electrode includes steps of: integrally forming a first sub-electrode and a first connection part; integrally forming a second sub-electrode and a second connection part so that the first sub-electrode and the second sub-electrode are insulated from each other and are disposed in different layers, wherein both the first connection part and the second connection part are connected to a drain of the thin film transistor.

Preferably, the step of integrally forming the second sub-electrode and the second connection part so that the first sub-electrode and the second sub-electrode are insulated from each other and are disposed in different layers includes: forming a first passivation layer on the first sub-electrode and the first connection part; and forming the second sub-electrode and the second connection part on the first passivation layer.

Preferably, before the step of forming the first sub-electrode, the manufacturing method further includes the following steps: providing a substrate; forming a gate, a gate insulation layer, an active layer, a source and a drain, a planarization layer, a common electrode and a second passivation layer on the substrate sequentially; and forming a second through hole in the second passivation layer so that the second through hole passes through the second passivation layer to reach the drain; wherein, the first sub-electrode and the first connection part are formed on the second passivation layer, and the first connection part is electrically connected to the drain by passing through the second through hole.

Preferably, before the step of forming the second sub-electrode, the manufacturing method further includes steps of: forming a first through hole in the first passivation layer so that the first through hole passes through the first passivation layer to reach the drain; wherein, the first through hole and the second through hole are coaxial, and the second connection part is electrically connected to the drain by passing through the first through hole.

Preferably, the first sub-electrode includes a first strip-shaped part and a first bending part connected to the first strip-shaped part; the first bending part and the first connection part are located at two ends of the first strip-shaped part, respectively; the second sub-electrode includes a second strip-shaped part and a second bending part connected to the second strip-shaped part; the second bending part and the second connection part are located at two ends of the second strip-shaped part, respectively; and an orthogonal projection of the first bending part on the array substrate is at least partially overlapped with an orthogonal projection of the second bending part on the array substrate.

With the present invention, the pixel electrode of the discrete pattern structure can be manufactured to have a narrow gap smaller than the resolution of the exposure machine, to solve the problem that the single-layered pixel electrode of the discrete pattern structure cannot be resolved by the existing exposure machine. Since in the pixel electrode of the discrete pattern structure, the smaller the gap between the two strips of sub-electrodes is, the higher the entire transmission of the product is, the present invention can effectively improve the entire transmission of the product.

BRIEF DESCRIPTION OF THE DRAWINGS

The drawings are used to provide further understanding of the present invention, and constitute a part of the description, and are used to interpret the present invention in conjunction with the following embodiments, and do not limit the present invention.

Figure 1:
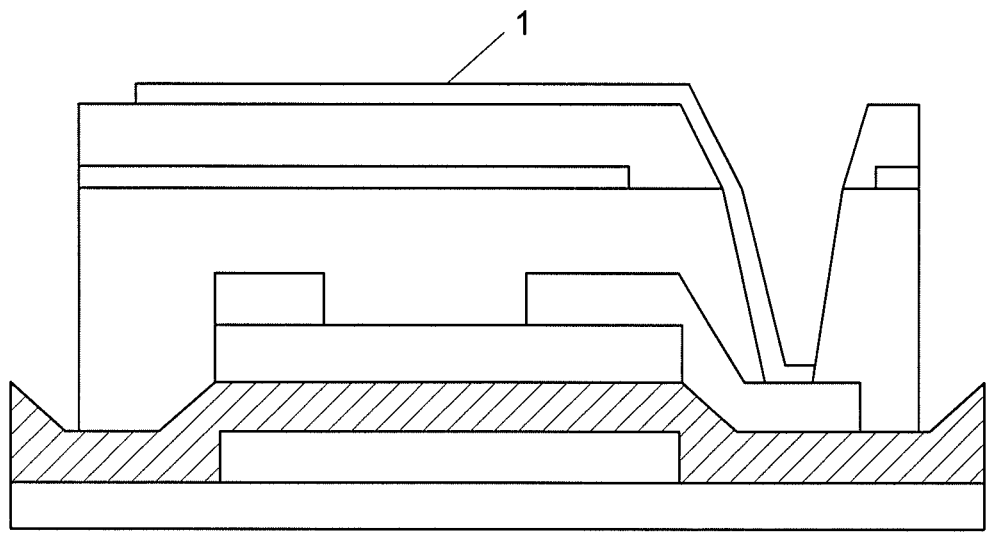
FIG. 1 is a schematic view of an array substrate in the prior art.
Figure 2:
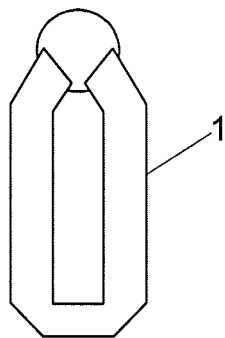
FIG. 2 is a top view of the pixel electrode.

In the drawings: 1, 2—pixel electrode; 201—first sub-electrode; 202—second sub-electrode; 201a—first strip-shaped part; 201b—first bending part; 202a—second strip-shaped part; 202b—second bending part; 203—first connecting part; 204—second connecting part; 3—first passivation layer; 4—substrate; 5—gate, 6—gate insulation layer; 7—active layer; 8—source; 9—drain; 10—planarization layer; 11—common electrode; 12—second passivation layer; and 13—coaxial through hole.

DETAILED DESCRIPTION OF THE EMBODIMENTS

The embodiments of the present invention will be described in detail in conjunction with the drawings below. It should be understood that, the embodiments described herein are only used to describe and interpret the invention, and are not used to limit the present invention.

Figure 3:
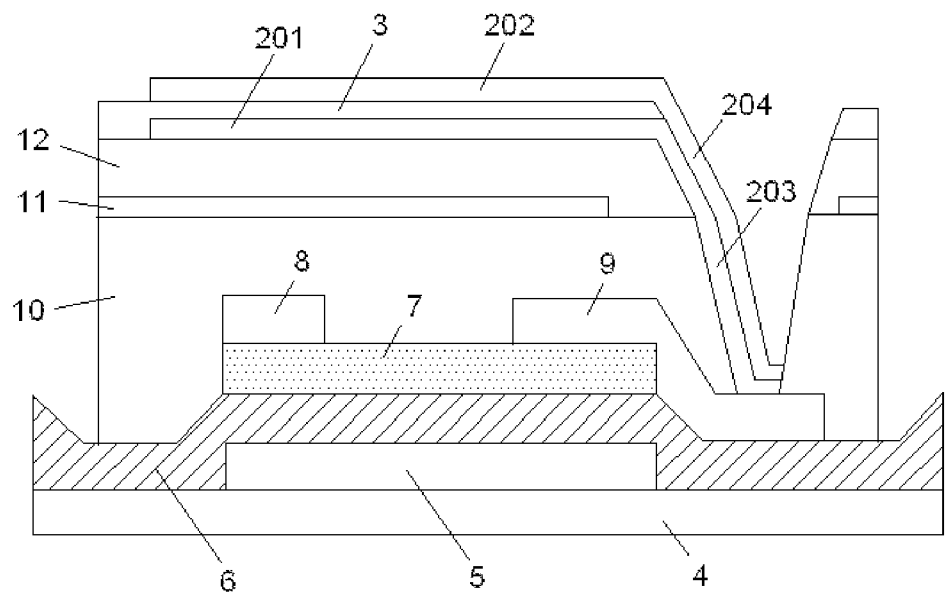
FIG. 3 is a schematic view of an array substrate provided by an embodiment of the present invention.

First, the present invention provides an array substrate which includes a pixel electrode and a thin film transistor, as shown in FIG. 3, the pixel electrode includes a first sub-electrode 201, a first connection part 203 formed integrally with the first sub-electrode 201, a second sub-electrode 202 and a second connection part 204 formed integrally with the second sub-electrode 202, the first sub-electrode 201 and the second sub-electrode 202 are insulated from each other and are disposed in different layers, and both the first connection part 203 and the second connection part 204 are connected to a drain 9 of the thin film transistor.

As described above, the electric field is strongest at the edges of the pixel electrode, where the liquid crystal molecules rotate largest, thus the pixel electrode is generally designed to have a discrete pattern structure in order to increase the transmission of the display product. However, as resolution of the display product is increased, the pitch between two adjacent pixels is becoming smaller gradually. In the prior art, due to the limitation of the resolution of the exposure machine, it is difficult to manufacture the pixel electrode of the discrete pattern structure with a smaller gap between two parts of the pixel electrode, which limits the transmission of the display product.

Figure 4:
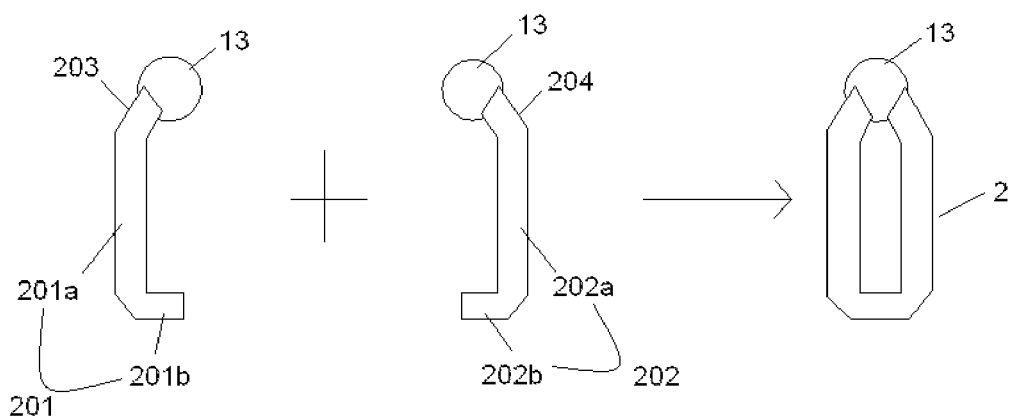
FIG. 4 is a top view illustrating formation of the pixel electrode provided by the embodiment of the present invention.

In the present invention, the pixel electrode is manufactured to have two parts. As shown in FIG. 4, the first sub-electrode 201 and the second sub-electrode 202 are jointed to form the pixel electrode 2. Thus, the pixel electrode can be manufactured to have a narrow gap smaller than the resolution of the exposure machine, that is, the first sub-electrode 201 and the second sub-electrode 202 have a smaller gap therebetween, which solves the problem that the single-layered pixel electrode of discrete structure cannot be resolved by the existing exposure machine.

In the pixel electrode of the discrete pattern structure, the smaller the gap between the two strips of sub-electrodes is, the higher the entire transmission of the product is, thus the invention can effectively increase the entire transmission of the product.

In an embodiment of the invention, a first passivation layer 3 is disposed between the first sub-electrode 201 and the second sub-electrode 202, and the first sub-electrode 201 and the second sub-electrode 202 are insulated from each other by the first passivation layer 3.

In the present invention, selection of material and thickness of the first passivation layer 3 making the first sub-electrode 201 and the second sub-electrode 202 insulated from each other can be optimized to the largest extent so that the pixel electrode 2 in the present invention has the same behavior of causing the liquid crystal molecules to rotate as the single-layered pixel electrode in the prior art.

For example, when the thickness of the first passivation layer 3 is smaller, there is almost no difference between longitudinal heights of the first sub-electrode 201 and the second sub-electrode 202, and in conjunction with the current process capability, the first passivation layer 3 preferably has a thickness in the range of 300 Å-500 Å.

In addition, in the subsequent processes, difference between longitudinal heights of the first sub-electrode 201 and the second sub-electrode 202 may also be decreased by adjusting thicknesses of the alignment layer at regions corresponding to the first sub-electrode 201 and the second sub-electrode 202, so as to maintain the surface flatness of the array substrate.

The material of the first passivation layer 3 is not limited in the present invention, as long as it meets the above requirement of thickness, and its dielectric constant meets the requirement of insulation. For example, the first passivation layer 3 may be made of any one or more of silicon oxide and silicon nitride.

In particular, as shown in FIG. 4, the first sub-electrode 201 includes a first strip-shaped part 201a and a first bending part 201b connected to the first strip-shaped part 201a; the first bending part 201b and the first connection part 203 are located at two ends of the first strip-shaped part 201a, respectively; the second sub-electrode 202 includes a second strip-shaped part 202a and a second bending part 202b connected to the second strip-shaped part 202a; the second bending part 202b and the second connection part 204 are located at two ends of the second strip-shaped part 202a, respectively; and an orthogonal projection of the first bending part 201b on the array substrate is at least partially overlapped with an orthogonal projection of the second bending part 202b on the array substrate.

The reason why the orthogonal projections of the first bending part 201b and the second bending part 202b on the array substrate are at least partially overlapped with each other is to ensure that the entire pixel electrode 2 can be constituted by the two sub-electrodes, and to from an entire electric field together with the common electrode so as to maintain the normal rotation of the liquid crystal molecules. Thus, at the region where the first bending part 201b and the second bending part 202b are joined, the first bending part 201b and the second bending part 202b should be designed to have respective reserved portions for overlapping, so as to ensure the display effect.

Preferably, one of the first sub-electrode 201 and the second sub-electrode 202 located in the lower layer has a width larger than or equal to that of the other one in the upper layer. Under the assumption that the first sub-electrode 201 is located in the lower layer, taking FIG. 4 as an example, the first strip-shaped part 201a has a width larger than or equal to that of the second strip-shaped part 202a. The width of the sub-electrode located in the lower layer is properly increased, so difference between respective electric fields formed between the two sub-electrodes and the common electrode can be decreased and difference between behaviors of the two sub-electrodes for driving the liquid crystal molecules to rotate can be effectively decreased, which ensures that the pixel electrode 2 in the present invention and the single-layered discrete pixel electrode in the prior art have the same luminous efficiency and display effect.

Referring to FIG. 3, the array substrate further includes a substrate 4, and a gate 5, a gate insulation layer 6, an active layer 7, a source 8 and a drain 9, a planarization layer 10, a common electrode 11 and a second passivation layer 12 sequentially disposed on the substrate 4. The pixel electrode provided by the invention is formed on the second passivation layer 12.

In the embodiment shown in FIG. 3, the pixel electrode is formed to be located at the top layer of the array substrate, and it should be understood that, the pixel electrode provided by the present invention should also be applicable to other form of array substrate, which will not repeated herein.

As described above, the second passivation layer 12 is provided with a second through hole therein, the first connection part 203 is electrically connected to the drain 9 by passing through the second through hole, a first passivation layer 3 is disposed between the first sub-electrode 201 and the second sub-electrode 202; the first passivation layer 3 is provided with a first through hole therein; the second connection part 204 is electrically connected to the drain 9 by passing through the first through hole; and the first through hole and the second through hole are disposed coaxially.

Referring to the top view shown in FIG. 4, both the first connection part 203 and the second connection part 204 are electrically connected to the drain 9 of the thin film transistor by passing through the coaxial through hole 13.

Obviously, the first connection part 203 and the second connection part 204 may also be electrically connected to the drain 9 of the thin film transistor by passing through different through holes, respectively. However, the above coaxial through hole can facilitate layout design and save the cost.

The present invention further provides a display device, including the above array substrate provided by the present invention. The display device may be any product or component having a display function, such as a mobile phone, a tablet computer, a television set, a display, a laptop computer, a digital photo frame, a navigator, and the like. In the display device provided by the present invention, since the gap between the two strips of sub-electrodes of the pixel electrode of the discrete pattern structure can be manufactured to be smaller, the degree of causing the liquid crystal molecules to rotate can be enhanced so that the display device has a higher transmission.

The present invention further provides a manufacturing method of an array substrate, including steps of forming a thin film transistor and forming a pixel electrode, wherein the step of forming a pixel electrode includes steps of:

integrally forming a first sub-electrode and a first connection part;

integrally forming a second sub-electrode and a second connection part so that the first sub-electrode and the second sub-electrode are insulated from each other and are disposed in different layers, wherein both the first connection part and the second connection part are connected to a drain of the thin film transistor.

In the present invention, the pixel electrode is divided into two parts which are manufactured in two different layers, respectively, which can make the gap between the two strips of sub-electrodes be smaller, and obtains the pixel electrode of the discrete pattern structure with a narrow gap smaller than the resolution of the exposure machine, to solve the problem that the single-layered pixel electrode of the discrete pattern structure cannot be resolved by the existing exposure machine. Since in the pixel electrode of the discrete pattern structure, the smaller the gap between the two strips of sub-electrodes is, the higher the entire transmission of the product is, and thus the present invention can effectively improve the entire transmission of the product.

Preferably, the step of integrally forming a second sub-electrode and a second connection part so that the first sub-electrode and the second sub-electrode are insulated from each other and are disposed in different layers includes:

forming a first passivation layer on the first sub-electrode and the first connection part; and forming the second sub-electrode and the second connection part on the first passivation layer.

In the present invention, the thickness of the first passivation layer can be controlled to be relatively small, which facilities to ensure that electric fields between the two sub-electrodes and the common electrode are consistent with each other, so that the pixel electrode in the present invention has the same behavior of causing the liquid crystal molecules to rotate as the single-layered pixel electrode in the prior art.

Preferably, the first passivation layer has a thickness in the range of 300 Å-500 Å. The material for making the first passivation layer is not limited in the present invention, as long as it meets the above requirement of thickness, and its dielectric constant meets the requirement of insulation. For example, the first passivation layer may be made of any one or more of silicon oxide and silicon nitride.

Further, before the step of forming the first sub-electrode, the manufacturing method further includes the following steps:
providing a substrate;
forming a gate, a gate insulation layer, an active layer, a source and a drain, a planarization layer, a common electrode and a second passivation layer on the substrate sequentially; and
forming a second through hole in the second passivation layer so that the second through hole passes through the second passivation layer to reach the drain;
wherein, the first sub-electrode and the first connection part are formed on the second passivation layer, and the first connection part is electrically connected to the drain by passing through the second through hole.

Further, before the step of forming the second sub-electrode, the manufacturing method further includes steps of:
forming a first through hole in the first passivation layer so that the first through hole passes through the first passivation layer to reach the drain;
wherein, the first through hole and the second through hole are coaxial, and the second connection part is electrically connected to the drain by passing through the first through hole.

It should be understood that, the first connection part and the second connection part may also be electrically connected to the drain of the thin film transistor by passing through different through holes, respectively. However, the above coaxial through hole can facilitate layout design and save the cost.

Preferably, the first sub-electrode includes a first strip-shaped part and a first bending part connected to the first strip-shaped part; the first bending part and the first connection part are located at two ends of the first strip-shaped part, respectively; the second sub-electrode includes a second strip-shaped part and a second bending part connected to the second strip-shaped part; the second bending part and the second connection part are located at two ends of the second strip-shaped part, respectively; and an orthogonal projection of the first bending part on the array substrate is at least partially overlapped with an orthogonal projection of the second bending part on the array substrate.

In the following, the manufacturing method provided by the present invention will be described in detail in conjunction with FIGS. 3 and 4.

First, a substrate 4 is provided, a gate 5, a gate insulation layer 6, an active layer 7, a source 8 and a drain 9, a planarization layer 10, a common electrode 11 and a second passivation layer 12 are sequentially manufactured on the substrate 4, and a second through hole is formed in the second passivation layer 12.

Then, a first mask plate is used to form the first sub-electrode 201 and the first connection part 203 of the pixel electrode 2 on the second passivation layer 12 so that the first connection part 203 is electrically connected to the drain 9 by passing through the second through hole in the second passivation layer 12.

Subsequently, a thin first passivation layer 3 is deposited on the first sub-electrode 201, and the first passivation layer 3 is etched to form a first through hole at the same position of the second through hole.

Subsequently, a second mask plate is used to form the second sub-electrode 202 and the second connection part 204 of the pixel electrode 2 on the first passivation layer 3 so that the second connection part 204 is electrically connected to the drain 9 via the first through hole.

Moreover, as shown in FIG. 4, the first sub-electrode 201 includes a first strip-shaped part 201a and a first bending part 201b connected to the first strip-shaped part 201a; the second sub-electrode 202 includes a second strip-shaped part 202a and a second bending part 202b connected to the second strip-shaped part 202a. In order to make the two sub-electrodes constitute the entire pixel electrode 2, and form an entire electric field together with the common electrode 11 therebetween so as to maintain the normal rotation of the liquid crystal molecules, orthogonal projections of the first bending part 201b and the second bending part 202b on the array substrate are at least partially overlapped with each other.

With the above manufacturing procedure, the pixel electrode of the discrete pattern structure can be manufactured to have a gap between the two strips of sub-electrodes smaller than the resolution of the exposure machine, so as to effectively increase the entire transmission of the display product.

It should be understood that, the foregoing embodiments are only exemplary embodiments used for explaining the principle of the present invention, but the present invention is not limited thereto. Various variations and improvements may be made by a person skilled in the art without departing from the protection scope of the present invention, and these variations and improvements also fall into the protection scope of the present invention.

What is claimed is:
1. An array substrate, including a pixel electrode, a common electrode, and a thin film transistor, wherein
the pixel electrode is arranged above the common electrode, and includes a first sub-electrode, a first connection part formed integrally with the first sub-electrode, a second sub-electrode, and a second connection part formed integrally with the second sub-electrode;
the first sub-electrode and the second sub-electrode are insulated from each other and are disposed on different layers; and
both the first connection part and the second connection part are connected to a drain of the thin film transistor,
wherein a first passivation layer is disposed between the first sub-electrode and the second sub-electrode, and the first sub-electrode and the second sub-electrode are insulated from each other by the first passivation layer, and wherein the first sub-electrode is directly disposed on a second passivation layer, and the second sub-electrode is directly disposed on the first passivation layer, and
wherein the first sub-electrode includes a first strip-shaped part and a first bending part connected to the first strip-shaped part, which are disposed on the second passivation layer;
the first bending part and the first connection part are located at two ends of the first strip-shaped part, respectively;
the second sub-electrode includes a second strip-shaped part and a second bending part connected to the second strip-shaped part, which are disposed on the first passivation layer;
the second bending part and the second connection part are located at two ends of the second strip-shaped part, respectively;

an orthogonal projection of the first bending part on the array substrate is at least partially overlapped with an orthogonal projection of the second bending part on the array substrate;

an orthogonal projection of the first strip-shaped part and an orthogonal projection of the second strip-shaped part do not overlap with each other; and the first bending part and the second bending part are electrically connected to each other via the first strip-shaped part, the first connection part, the second strip-shaped part and the second connection part.

2. The array substrate according to claim 1, wherein the first passivation layer has a thickness in the range of 300 Å-500 Å.

3. The array substrate according to claim 1, wherein the first passivation layer is made of any one or more of silicon oxide and silicon nitride.

4. The array substrate according to claim 1, wherein the first sub-electrode has a width larger than or equal to that of the second sub-electrode.

5. The array substrate according to claim 1, further including a substrate, and a gate, a gate insulation layer, an active layer, a source, a planarization layer, and the common electrode sequentially disposed on the substrate.

6. The array substrate according to claim 5, wherein
the second passivation layer is provided with a second through hole therein;
the first connection part is electrically connected to the drain by passing through the second through hole;
the first passivation layer is provided with a first through hole therein;
the second connection part is electrically connected to the drain by passing through the first through hole; and
the first through hole and the second through hole are disposed coaxially.

7. A display device, including the array substrate according to claim 1.

8. A manufacturing method of an array substrate, including steps of forming a thin film transistor, and forming a pixel electrode and a common electrode such that the pixel electrode is arranged above the common electrode, wherein the step of forming a pixel electrode includes steps of:
integrally forming a first sub-electrode and a first connection part on a second passivation layer;
forming a first passivation layer on the first sub-electrode and the first connection part;
integrally forming a second sub-electrode and a second connection part on the first passivation layer so that the first sub-electrode and the second sub-electrode are insulated from each other and are disposed in different layers,
wherein both the first connection part and the second connection part are connected to a drain of the thin film transistor; and wherein the first sub-electrode includes a first strip-shaped part and a first bending part connected to the first strip-shaped part, which are disposed on the second passivation layer;

the first bending part and the first connection part are located at two ends of the first strip-shaped part, respectively;

the second sub-electrode includes a second strip-shaped part and a second bending part connected to the second strip-shaped part, which are disposed on the first passivation layer;

the second bending part and the second connection part are located at two ends of the second strip-shaped part, respectively;

an orthogonal projection of the first bending part on the array substrate is at least partially overlapped with an orthogonal projection of the second bending part on the array substrate;

an orthogonal projection of the first strip-shaped part and an orthogonal projection of the second strip-shaped part do not overlap with each other; and the first bending part and the second bending part are electrically connected to each other via the first strip-shaped part, the first connection part, the second strip-shaped part and the second connection part.

9. The manufacturing method according to claim 8, wherein before the step of forming the first sub-electrode, the manufacturing method further includes the following steps:
providing a substrate;
forming a gate, a gate insulation layer, an active layer, a source, a planarization layer, the common electrode and a second passivation layer on the substrate sequentially; and
forming a second through hole in the second passivation layer so that the second through hole passes through the second passivation layer to reach the drain;
wherein, the first sub-electrode and the first connection part are formed on the second passivation layer, and the first connection part is electrically connected to the drain by passing through the second through hole.

10. The manufacturing method of claim 9, wherein before the step of forming the second sub-electrode, the manufacturing method further includes steps of:
forming a first through hole in the first passivation layer so that the first through hole passes through the first passivation layer to reach the drain;
wherein, the first through hole and the second through hole are coaxial, and the second connection part is electrically connected to the drain by passing through the first through hole.

* * * * *